United States Patent [19]
Yoon et al.

[11] Patent Number: 6,137,296
[45] Date of Patent: Oct. 24, 2000

[54] PROBE CARD FOR TESTING SEMICONDUCTOR DEVICES

[75] Inventors: Jong-Chil Yoon, Seoul; Jeung-Dae Kim; Young-Syup Kim, both of Kyunggi-do, all of Rep. of Korea

[73] Assignee: Samsung Electronics, Co., Ltd., Suwon, Rep. of Korea

[21] Appl. No.: 09/148,864

[22] Filed: Sep. 8, 1998

[30] Foreign Application Priority Data

Sep. 8, 1997 [KR] Rep. of Korea ..................... 97-46196

[51] Int. Cl.⁷ .......................... G01R 31/02; H01R 13/00
[52] U.S. Cl. ......................... 324/754; 324/761; 439/482
[58] Field of Search ................................. 324/754, 755, 324/758, 761, 760, 762; 439/482

[56] References Cited

U.S. PATENT DOCUMENTS

| | | | |
|---|---|---|---|
| 4,488,111 | 12/1984 | Widdowson | 324/762 |
| 4,567,432 | 1/1986 | Buol et al. | 324/760 |
| 5,517,126 | 5/1996 | Yamaguchi | 324/758 |
| 5,952,843 | 9/1999 | Vinh | 324/761 |
| 6,020,747 | 2/2000 | Bahns et al. | 324/754 |

*Primary Examiner*—Safet Metjahic
*Assistant Examiner*—Anjan K Deb
*Attorney, Agent, or Firm*—Jones Volentine, LLC

[57] ABSTRACT

A probe card, used for testing the electric characteristics of semiconductor devices, is disclosed. The probe card has main and subsidiary cards. The main card has a main circuit used for testing the electric characteristics of semiconductor devices. The subsidiary card carries a test tip and is detachably attached to the main card into a module when it is necessary to test the electric characteristics of semiconductor devices. A package card in place of the sub-card may be used with the main card. The package card is used for testing the electric characteristics of semiconductor packages having semiconductor chips tested by the subsidiary card. Therefore, it is possible for the probe card to effectively compare test data of the semiconductor chips of a wafer to test data of finally bonded and molded semiconductor packages having the above chips.

11 Claims, 5 Drawing Sheets

PROBE CARD FOR TESTING SEMICONDUCTOR DEVICES

FIELD OF THE INVENTION

The present invention relates, in general, to a test system used for testing the electric characteristics of the semiconductor chips of a wafer during a process for testing semiconductor devices and, more particularly, to a probe card of such a test system specifically used for testing semiconductor devices.

BACKGROUND OF THE INVENTION

As well known to those skilled in the art, the process for testing semiconductor devices is performed after the fabrication of wafers to measure the quality of semiconductor chips of each wafer. During the chip testing process, it is possible to pick out bad quality chips from high quality chips prior to returning repairable chips to the fabrication process to recycle them. Such bad quality chips are thus completely prevented from being further processed. This testing process effectively reduces the packaging and testing cost while producing semiconductor devices.

FIG. 1A shows a typical test system used in the process for testing the semiconductor devices.

FIG. 1B is an overhead view of the wafer in FIG. 1A.

As shown in FIG. 1A, the system 1 comprises a tester 10, a prober 12, and an executing board 14. The tester 10 outputs an electric signal to a semiconductor device and reads response data to determine whether the semiconductor device has normal characteristics. The prober 12 is for loading a wafer 18 on a die in a way such that a probe card 16 is aligned with and brought into contact with the wafer 18. It is possible for the above prober 12 to selectively unload the wafer 18 from the die or to move the wafer 18 within dimensions of the die under the control of the tester 10. The executing board 14 transmits the signal from the tester 10 to the prober 12.

FIG. 1B is an overhead view of the wafer 18 in FIG. 1A. As shown in FIG. 1B, the wafer 18 includes a semiconductor device 17 having terminals 19. Although only one semiconductor device 17 is shown, it is understood that there may be more than one on the wafer 18.

During the operation of the above testing system 1, the signal output from the tester 10 is transmitted to the test tip 15 of the probe card 16 through the executing board 14. The test tip is thereafter brought into contact with the terminals 19 of each of the semiconductor devices 17 of the wafer 18, thus allowing an electric signal to flow into the circuit of the semiconductor device.

Such probe cards are typically classified into two types: blade type cards and epoxy type cards in accordance with the types of test tips. The blade type cards individually have a blade type test tip, while the epoxy type cards individually have an epoxy type test tip. The blade type probe cards are generally used for testing semiconductor devices having sixty or fewer pins.

The process for testing semiconductor devices comprises the steps of mounting a test tip on the probe card 16, applying an electric signal to each semiconductor chip of a wafer 18 through the test tip, and determining a production yield of the semiconductor devices by checking the electric characteristics of each device. The test tip thus comes into repeated contact with the semiconductor chips and this reduces the expected life span of such a test tip. This also forces the owner of the system to frequently change the test tip with a new one and reduces productivity of semiconductor devices.

Due to such repeated contact of the test tip with the semiconductor chips, the metal test tip can become scratched and/or frictionally abraded so that the contact area of the tip per unit is enlarged, which increases the contact resistance of the test tip. In such a case, the test system may fail to exactly measure the electric characteristics of the semiconductor chips, thus sometimes measuring normal chips as abnormal chips thereby reducing the manufacturing yield of the chips. In particular, when wafers for linear integrated circuit devices are tested by the typical test system, it is necessary to use an application circuit, active and passive elements along with the probe card. In such a case, it is almost impossible to automatically measure the characteristics, such as resistance, electrostatic capacity, and flatness, of the test tip so that the test tip has to be checked by the naked eye of a user. In addition, the repeated changing of test tips may force the solder mark of the probe card to be unexpectedly removed from the probe card due to the high temperature soldering heat. In such a case, the probe card has to be changed with a new one, which forces the owner of the system to newly produce a probe card, newly register data in the new card, and check the manufacturing yield.

SUMMARY OF THE INVENTION

Accordingly, the present invention has been made keeping in mind the above problems occurring in the prior art. An object of the present invention is to provide a probe card that is used as a part of a test system for testing the electric characteristics of a semiconductor chip of a wafer during a process for testing semiconductor devices; that is effectively used for a lengthy period of time; and that easily and reliably tests the electric characteristics of the semiconductor device.

In order to accomplish the above object, the present invention provides a probe card module of a test system used for testing electric characteristics of a semiconductor device, comprising a main card electrically connected to the test system and having an electronic circuit for testing the electric characteristics of the semiconductor device, and a subsidiary card detachably connected to the main card and provided with a test tip, the test tip being selectively brought into contact with terminals of the semiconductor device.

The main card comprises a main circuit board, a main center hole in the main circuit board, a plurality of pin holes formed on the main circuit board around an edge of the main center hole and spaced apart from a center of the main center hole at regular intervals, a plurality of pogo pins respectively engaging with the plurality of pin holes, a plurality of first thin plates provided on one surface of the main circuit board, each radially extending between one of the plurality of the pin holes and the edge of the main center hole, the first thin plates being used for mounting a test tip on the main circuit board, and at least one pair of first locking holes formed in the main circuit board at diametrically opposite positions around the main center hole and outside the pin holes. It may also comprise at least one first heat dissipating hole formed on each of the plurality of first thin plates.

The above subsidiary card comprises a subsidiary circuit board having a subsidiary center hole at a position corresponding to the main center hole of the main card, a plurality of second thin plates provided on one surface of the subsidiary circuit board and radially extending from an edge of the subsidiary center hole to positions where the pogo pins come into electric contact with outside ends of the second thin plates, and at least one pair of second locking holes formed on the subsidiary circuit board at diametrically opposite positions corresponding to the first locking holes of the main card. The subsidiary card may also comprise at least one second heat dissipating hole formed on each of the second thin plates.

The probe card may further comprise a package card detachably assembled with the main card, the package card having an electronic circuit selectively and electrically connected to terminals of a semiconductor package.

The package itself may comprise a package circuit board, a plurality of pin holes formed on the package circuit board at positions spaced apart from a center of the package circuit board at regular intervals, thus engaging with the fog pins when the package card is assembled with the main card, a plurality of pads formed on one surface of the package circuit board and selectively and electrically connected to the terminals of the semiconductor package when the package card engages with the semiconductor package, a pattern provided on the package circuit board to respectively and electrically connect the pads to the pin holes, and at least one pair of third locking holes formed on the package circuit board at diametrically opposite positions corresponding to the first locking holes of the main card when the main and package cards are assembled together.

The test tip may be an epoxy type test tip, a blade type test tip 1A, or any other tip suitable for testing.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1A:
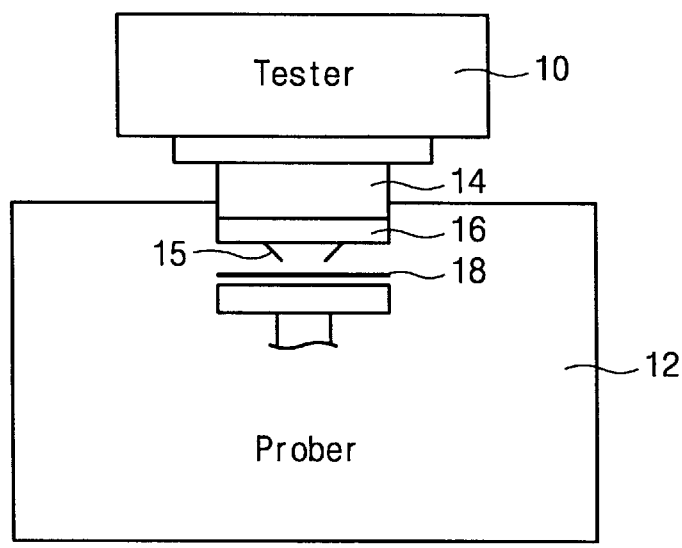
FIG. 1A is a schematic view showing the construction of a conventional test system used in the process for testing semiconductor devices.
Figure 1B:
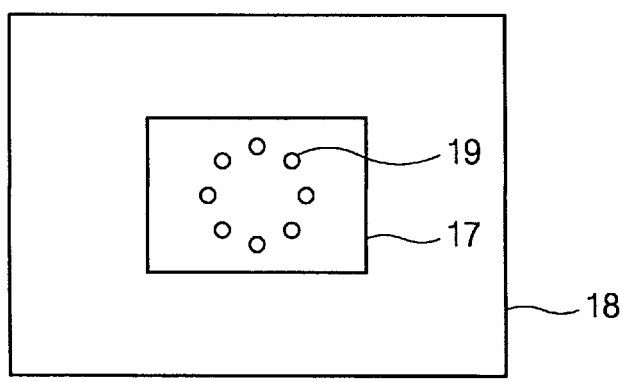
FIG. 1B is an overhead view of the wafer in FIG 1A.

As shown in FIG. 1, the construction of a typical test system 1 used for testing electric characteristics of semiconductor devices includes a probe card 16. This probe card 16 is integrated with a test tip that is brought into repeated contact with the terminals of semiconductor chips. Therefore, such a test tip may be easily broken, which prevents the test system 1 from exactly testing the electric characteristics of semiconductor devices. It is also almost impossible for a system 1 with such a probe card 16 to allow a semiconductor device production process to produce high quality semiconductor devices without failure. Due to the repeated contact of the test tip with the chips, the test tip may be easily abraded and/or broken, which forces the owner of the system 1 to frequently and periodically check the probe card 16 and timely change any probe card with an abraded or broken test tip with a new one. However, the test tip is integrated with the probe card 16 through a soldering process, so that such a repeated changing of the test tip lastly results in a breakage of the probe card 16.

In order to overcome such a problem, the present invention designs the probe card so that the test tip is detachably attached to the main body of the probe card and is easily removed from the main body of the card when necessary. The invention thus allows the main body of the probe card to be effectively used for a lengthy period of time while reducing the managing cost of the probe card.

Figure 2:
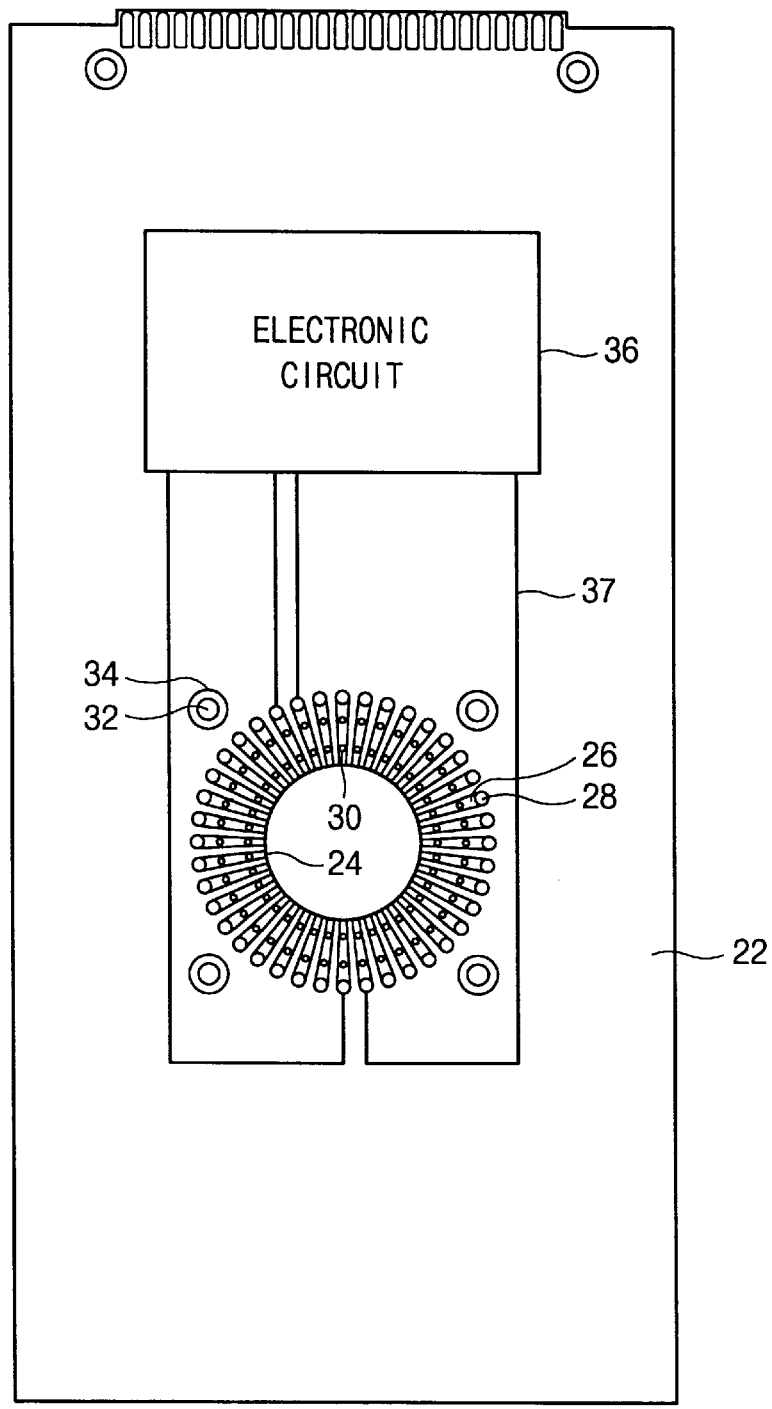
FIG. 2 is a plan view showing the appearance of a main card of the probe card in accordance with a preferred embodiment of this invention.

FIG. 2 is a plan view showing the appearance of a main card of the probe card in accordance with a preferred embodiment of this invention.

As shown in FIG. 2, the main card 20 comprises a main circuit board 22 having a main center hole 24 with a predetermined radius. A plurality of pin holes 28, used for engaging with pogo pins, are formed around the edge of the main center hole 24 at positions spaced apart from the center of the hole 24 at regular intervals. The circuit board 22 also has a plurality of thin plates 26 on each of which a test tip is mounted. The above thin plates 26 are all positioned on one surface of the circuit board 22 and individually and radially extend between an associated pin hole 28 and the edge of the main center hole 24.

At least one pair of main locking holes 32 are formed on the circuit board 22 at diametrically opposite positions around the main center hole 24 and outside the pin holes 28. The locking holes 32 are for assembling the main and subsidiary cards into a module. It is necessary to form a boss 34 along the circular edge of each locking hole 32, thus eliminating any interference between the electronic circuit of the main card 20 and a locking means when the main card 20 is assembled with another card into a module. At least one heat dissipating hole 30 is formed on each thin plate 26, thus effectively dissipating heat from the thin plates 26 into the atmosphere during a soldering process for mounting a test tip to the thin plates 26. It is thus possible to almost completely prevent the thin plates 26 from being separated or peeling from the circuit board 22 during a soldering process.

Figure 3:
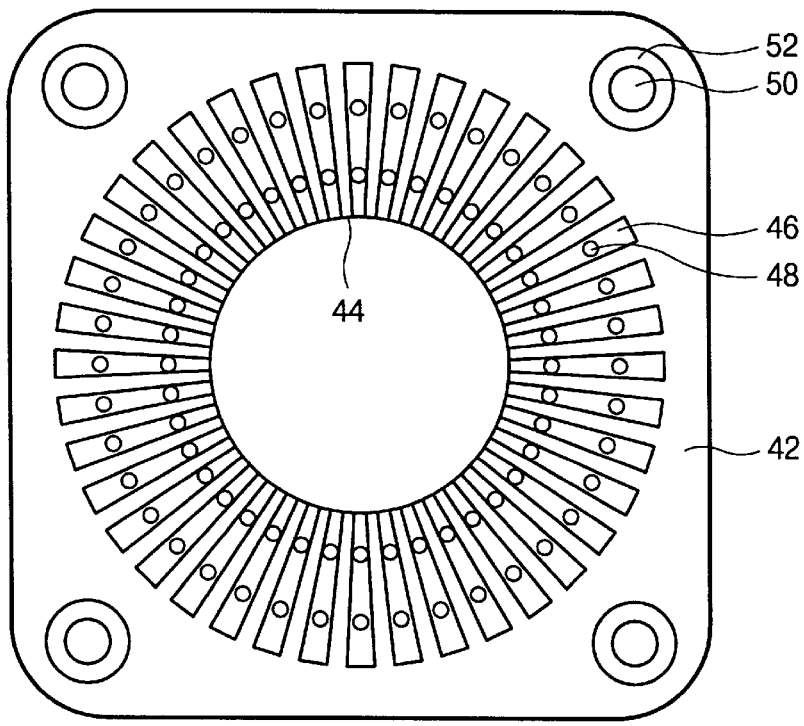
FIG. 3 is a plan view showing the appearance of a subsidiary card detachably assembled with the above main card of a preferred embodiment this invention into a module.

FIG. 3 is a plan view showing the appearance of a subsidiary card referred to as a sub-card 40 which is detachably assembled with the main card 20 into a module. The above sub-card 40 allows the main card 20 to be operated in connection with a test tip while performing an operation expected from a typical probe card soldered with such a test tip.

As shown in FIG. 3, the sub-card 40 comprises a sub circuit board 42 having a sub center hole 44 with a predetermined radius. The sub center hole 44 is formed on the board 42 at a position corresponding to the main center hole 24 of the main card 20 when the two cards 20 and 40 are assembled into a module. The circuit board 42 also has a plurality of thin plates 46 on which the test tip is mounted. The above thin plates 46 individually and radially extend from the edge of the sub center hole 44 to a position where the pogo pins come into electric contact with the outside ends of the plates 46 when the main and sub-cards 20 and 40 are assembled into a module. In the same manner as that described for the main card 20, at least one pair of sub locking holes 50 are formed on the circuit board 42 of the sub-card 40 at diametrically opposite positions around the sub center hole 44 and outside the thin plates 46. The above sub locking holes 50 are positioned to be aligned with the main locking holes 32 of the main card 20 when the main and sub-cards 20 and 40 are assembled into a module. Of course, a boss 52 is formed along the circular edge of each sub locking hole 50, thus eliminating any interference between the circuit of the sub-card 40 and a locking means when the sub-card 40 is assembled with another card into a module. In addition, at least one heat dissipating hole 48 is formed on each thin plate 46, thus effectively dissipating heat from the thin plates 46 into the atmosphere during a soldering process for mounting a test tip to the thin plates 46. It is thus possible to almost completely prevent the thin plates 46 from being separated or peeling from the circuit board 42 during a soldering process.

The probe card of this invention preferably comprises two cards: main and sub-cards. In the above probe card, the main card has a plurality of radial thin plates, so that a test tip is mounted to the main card through the thin plates. Therefore, the main card may be used as a probe card without being assembled with any sub-card. Due to such a double card structure of this probe card, it is possible for a user to primarily use the main card as a probe card for a period of time with a test tip being mounted to the thin plates of the main card. It is also possible for the user to secondarily use the sub-card as a probe card with a test tip being mounted to the thin plates of the sub-card when the thin plates of the main card are broken to fail to allow any test tip to be mounted thereon through a soldering process.

Figure 4:
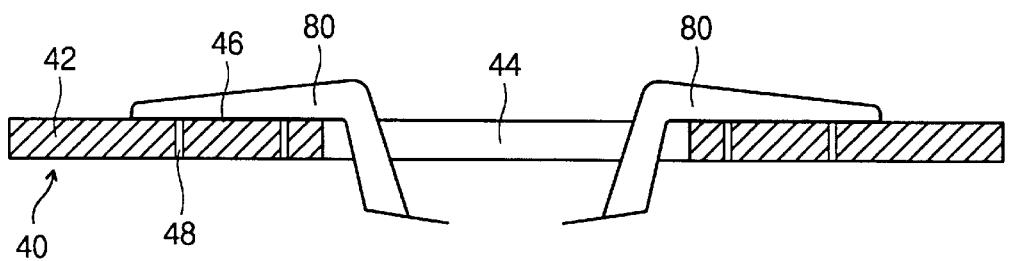
Fig. 4 is a sectional view showing a test tip mounted on the subsidiary card of a preferred embodiment of this invention.

FIG. 4 is a sectional view showing a test tip mounted on the sub-card of this invention. As shown in the drawing, a test tip 80 is mounted on the radial thin plates 46 of the sub-card 40 through a soldering process. During a soldering process for mounting such a test tip 80 on the plates 46 of the sub-card 40, processing heat is effectively dissipated into the atmosphere through the heat dissipating holes 48. In the present invention, a test tip 80 is mounted on the thin plates 46 of the sub-card 40 through the same process as that of the main card 20.

Figure 5:
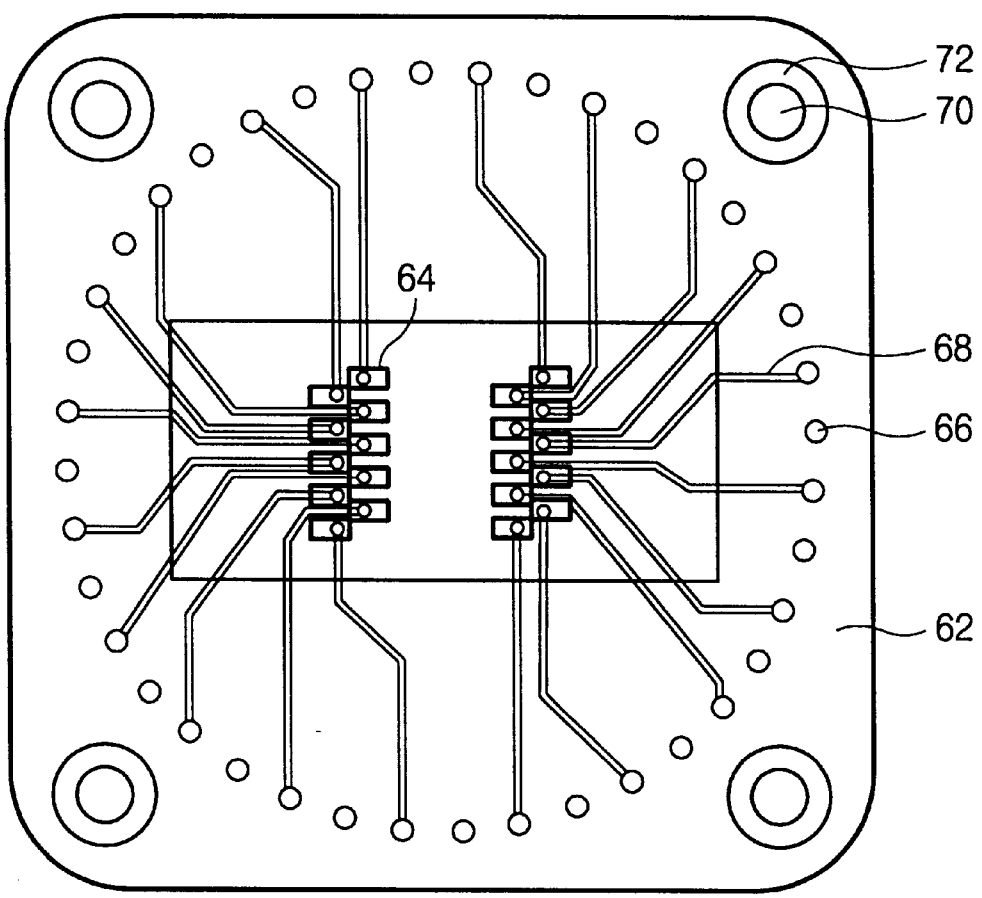
FIG. 5 is a plan view of a package card selectively assembled with the main card of a preferred embodiment of this invention into a module and used for testing the electric characteristics of semiconductor packages.

FIG. 5 is a plan view of a package card selectively assembled with the main card of this invention into a module and used for testing the electric characteristics of semiconductor packages. The above package card 60 may be assembled with the main card 20 and is used for testing the electric characteristics of a semiconductor package having a semiconductor chip tested by the sub-card 40. The probe card of this invention thus compares test data of the semiconductor chips of a wafer to test data of finally bonded and molded semiconductor packages having the above chips.

As shown in FIG. 5, the above package card 60 comprises a package circuit board 62. A plurality of pin holes 66, engaging with pogo pins when the card 60 is assembled with the main card 20 into a module, are formed on the board 62 at positions spaced apart from the center of the board 62 at regular intervals. In addition, a plurality of pads 64 are formed on one surface of the circuit board 62 and are electrically connected to the terminals of a semiconductor device when the card 60 engages with the semiconductor device. The above pads 64 are respectively and electrically connected to the pin holes 66 through a pattern 68. In the same manner as that described for the main and sub-cards 20 and 40, at least one pair of locking holes 70 are formed on the circuit board 62 of the package card 60 at diametrically opposite positions around the center of the board 62 outside the pin holes 66. The above locking holes 70 are positioned to be aligned with the main locking holes 32 of the main card 20 when the main and package cards 20 and 60 are assembled into a module. Of course, a boss 72 is formed along the circular edge of each locking hole 70, thus eliminating any interference between the circuit of the package card 60 and a locking means when the package card 60 is assembled with another card into a module.

Figure 6:
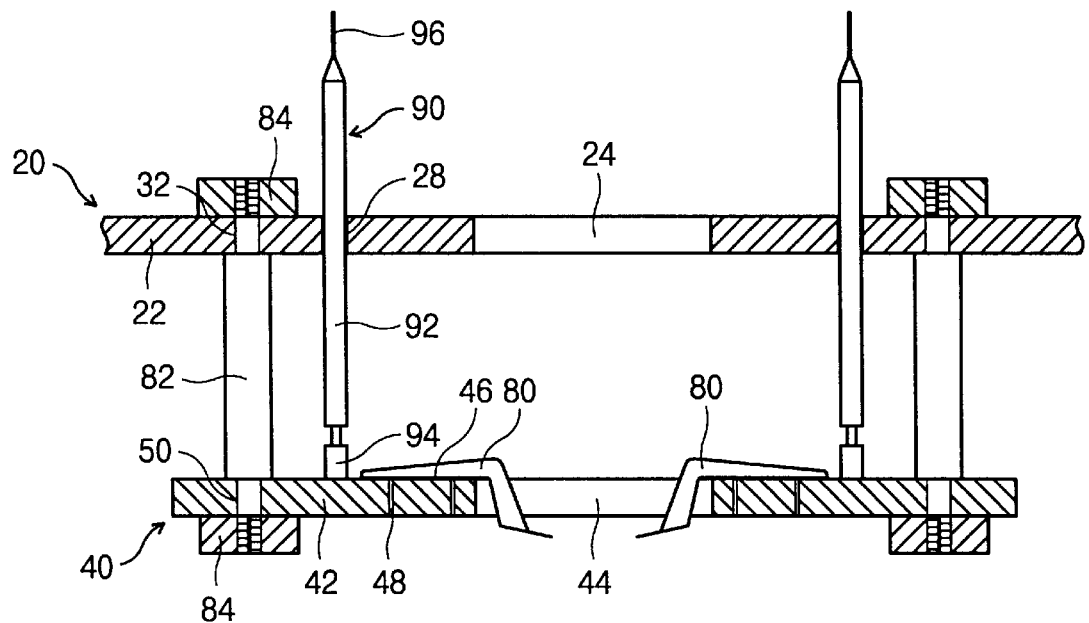
FIG. 6 is a sectional view showing the subsidiary card assembled with the main card of a preferred embodiment of this invention into a module.

FIG. 6 shows a sub-card 40 assembled with a main card 20 into a module.

As shown in the drawing, the sub-card 40 is mounted to the lower side of the main card 20. In such a case, the two cards 20 and 40 are assembled into a module using nuts 84 and bolts 82. In other words, the two cards 20 and 40 are arranged to be parallel with each other, with the bolts 82 being vertically interposed between the two cards 20 and 40 at corners and acting as spacers. Preferably, both ends, externally threaded, are fitted into the locking holes 32 and 50 of the two cards 20 and 40 prior to being tightened with the nuts 84 on the outside surfaces of the two cards 20 and 40. The thin plates 46 of the sub-card 40 are electrically connected to the electric circuit of the main card 20 through a plurality of pogo pins 90 of the main card 20. That is, the column body 92 of each pogo pin 90 is vertically fitted into and supported by the main card 20 and is electrically connected to the circuit of the main card 20. The first terminals 94 of the above pogo pins 90 are respectively connected to the thin plates 46 of the sub-card 40 with a test tip being mounted on the thin plates 46. In such a case, the above pogo pins 90 are individually spring-biased so that each pin 90 has a desired elasticity.

Figure 7:
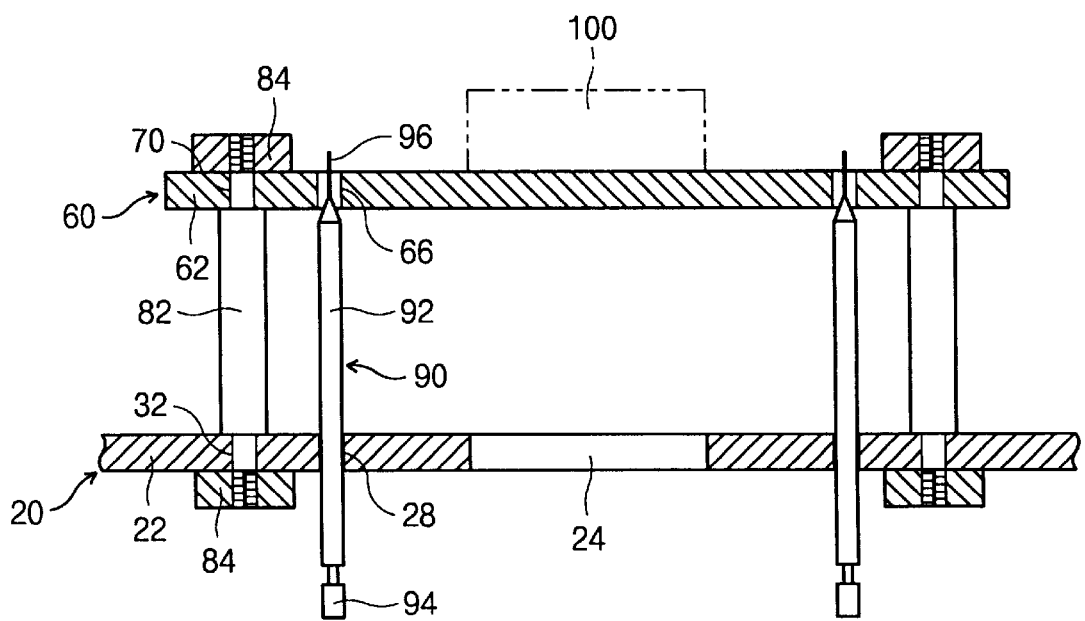
FIG. 7 is a sectional view showing the package card assembled with the main card of a preferred embodiment of this invention into a module.

FIG. 7 shows a package card 60 assembled with a main card 20 into a module. As shown in the drawing, the package card 60 is mounted to the upper side of the main card 20. The process for assembling the package card 60 with the main card 20 into a module is similar to that described for the sub-card 40 and further explanation is thus not deemed necessary.

The package card 60 is electrically connected to the electronic circuit of the main card 20 through the pogo pins 90 of the main card 20. That is, the column body 92 of each pogo pin 90 is vertically fitted into and supported by the main card 20 and is electrically connected to the circuit of the main card 20. The pin holes 66 of the package card 60 are electrically connected to the pads 64 of the package card 60, said pads 64 being also electrically connected to a semiconductor package 100 laid on the package card 60. In addition, the second terminals 96 of the above pogo pins 90 are respectively connected to the pin holes 66 of the package card 60, so that the package card 60 is electrically connected to the electronic circuit of the main card 20.

As described above, the present invention provides a probe card used for testing the electric characteristics of a semiconductor device. The probe card of this invention comprises two cards: a main card and a sub-card. The main card has a main circuit used for testing the electric characteristics of semiconductor devices. Meanwhile, the sub-card carries a test tip which is brought into contact with the terminals of the semiconductor devices. The probe card of this invention thus allows the main card to be effectively used for a lengthy period of time while reducing the managing cost of the probe card. In addition, the sub-card, having the test tip, is removably attached to the main card when it is necessary to test electric characteristics of the semiconductor devices. Therefore, the probe card easily performs a measurement for electric characteristics of semiconductor devices. Due to the probe card of this invention, the test system always exactly measures the electric characteristics of semiconductor devices, thus being almost free from testing error. The sub-card selectively and freely uses epoxy type test tips or blade type test tips, so that the probe card can be used for testing various wafers having different numbers of pins. In accordance with the present invention, a package card in place of the sub-card may be used with the main card. Such a package card is used for testing the electric characteristics of a semiconductor package having a semiconductor chip tested by the sub-card. The probe card of this invention thus compares test data of the semiconductor chips of a wafer to test data of finally bonded and molded semiconductor packages having the above chips.

In each of the main and sub-cards, a heat dissipating hole is formed on each thin plate, used for mounting a test tip on the card, so that the card effectively dissipates heat from the thin plates to the atmosphere during a soldering process for mounting a test tip to the thin plates. It is thus possible to almost completely prevent the thin plates from being separated or peeling from the circuit board during a soldering process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A probe card module of a test system used for testing electric characteristics of a semiconductor device, comprising:
    a main card electrically connected to the test system and having an electronic circuit for testing the electric characteristics of the semiconductor device; and
    a subsidiary card detachably connected to the main card and provided with a test tip, the test tip being selectively brought into contact with terminals of the semiconductor device, wherein the main card comprises
    a main circuit board;
    a main center hole in the main circuit board;
    a plurality of pin holes formed on the main circuit board around an edge of the main center hole and spaced apart from a center of the main center hole at regular intervals;
    a plurality of pogo pins respectively engaging with the plurality of pin holes;
    a plurality of first thin plates provided on one surface of the main circuit board, each radially extending between one of the plurality of the pin holes and the edge of the main center hole, the first thin plates being used for mounting a test tip on the main circuit board;
    at least one pair of first locking holes formed in the main circuit board at diametrically opposite positions around the main center hole and outside the pin holes; and
    at least one first heat dissipating hole formed on each of the plurality of first thin plates.

2. A probe card module as recited in claim 1, wherein the subsidiary card comprises:
    a subsidiary circuit board having a subsidiary center hole at a position corresponding to the main center hole of the main card;
    a plurality of second thin plates provided on one surface of the subsidiary circuit board and radially extending from an edge of the subsidiary center hole to positions where the pogo pins come into electric contact with outside ends of the second thin plates; and
    at least one pair of second locking holes formed on the subsidiary circuit board at diametrically opposite positions corresponding to the first locking holes of the main card.

3. A probe card module as recited in claim 2, wherein the subsidiary card comprises at least one second heat dissipating hole formed on each of the second thin plates.

4. A probe card module as recited in claim 1, further comprising:
    a package card detachably assembled with the main card, the package card having an electronic circuit selectively and electrically connected to terminals of a semiconductor package.

5. A probe card module as recited in claim 4, wherein the package card comprises:
    a package circuit board;
    a plurality of pin holes formed on the package circuit board at positions spaced apart from a center of the package circuit board at regular intervals, thus engaging with the pogo pins when the package card is assembled with the main card;
    a plurality of pads formed on one surface of the package circuit board and selectively and electrically connected to the terminals of the semiconductor package when the package card engages with the semiconductor package;
    a pattern provided on the package circuit board to respectively and electrically connect the pads to the pin holes; and
    at least one pair of third locking holes formed on the package circuit board at diametrically opposite positions corresponding to the first locking holes of the main card when the main and package cards are assembled together.

6. A probe card module as recited in claim 2, wherein the test tip is made of epoxy resin.

7. A probe card module as recited in claim 2 wherein the test tip is a blade type test tip.

8. A probe card module as recited in claim 9, wherein the main card comprises:
    a plurality of pogo pins; and
    a first fastening means formed on the main card at a diametrically opposite position corresponding to the second fastening means of the subsidiary card.

9. A probe card module of a test system used for testing electric characteristics of a semiconductor device, comprising:
    a main card electrically connected to the test system and having an electronic circuit for testing the electric characteristics of the semiconductor device; and
    a subsidiary card detachably connected to the main card and provided with a test tip, the test tip being selectively brought into contact with terminals of the semiconductor device, wherein the subsidiary card comprises:
    a subsidiary circuit board;
    a subsidiary center hole formed in the subsidiary circuit board;
    a plurality of thin plates provided on one surface of the subsidiary circuit board and radially extending from an edge of the subsidiary center hole to positions where the plurality of pogo pins come into electric contact with outside ends of the second thin plates;

a second fastening means formed on the subsidiary circuit board; and at least one second heat dissipating hole formed on each of the second thin plates.

10. A probe card module as recited in claim 9, wherein the test tip is made of epoxy resin.

11. A probe card module as recited in claim 9, wherein the test tip is a blade type test tip.

* * * * *